(12) United States Patent
Kim et al.

(10) Patent No.: US 9,123,723 B2
(45) Date of Patent: Sep. 1, 2015

(54) LINE STRUCTURE FOR REPAIR AND FLAT PANEL DISPLAY DEVICE HAVING THE SAME

(71) Applicant: SAMSUNG DISPLAY CO., LTD., Yongin, Gyeonggi-Do (KR)

(72) Inventors: Hyung-Soo Kim, Yongin (KR); Keun-Tae Jung, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/026,084

(22) Filed: Sep. 13, 2013

(65) Prior Publication Data

US 2014/0264338 A1    Sep. 18, 2014

(30) Foreign Application Priority Data

Mar. 14, 2013    (KR) .................. 10-2013-0027563

(51) Int. Cl.
*H01L 23/58*    (2006.01)
*H01L 29/10*    (2006.01)
*H01L 23/525*   (2006.01)

(52) U.S. Cl.
CPC .......... *H01L 23/5252* (2013.01); *H01L 23/525* (2013.01)

(58) Field of Classification Search
None
See application file for complete search history.

(56) References Cited

U.S. PATENT DOCUMENTS 5,303,074 A * 4/1994 Salisbury .................... 349/55

FOREIGN PATENT DOCUMENTS

| KR | 10-2001-0060584 A | 7/2001 |
| KR | 10-2005-0076913 A | 7/2005 |
| KR | 10-2009-0070308 A | 7/2009 |

* cited by examiner

*Primary Examiner* — Sonya D McCall Shepard
(74) *Attorney, Agent, or Firm* — Lee & Morse, P.C.

(57) ABSTRACT

A line structure for repair may include a first line in a first direction, a second line parallel with the first line, the second line having side portions extending along a second direction from respective end portions and coupled to the first line, and a third line intersecting the first and second lines, wherein at least one portion of the second line is made of undoped poly-silicon.

17 Claims, 3 Drawing Sheets

LINE STRUCTURE FOR REPAIR AND FLAT PANEL DISPLAY DEVICE HAVING THE SAME

RELATED APPLICATIONS

This application claims priority to and the benefit of Korean Patent Application No. 10-2013-0027563, filed on Mar. 14, 2013, in the Korean Intellectual Property Office, the entire contents of which are incorporated herein by reference in their entirety.

BACKGROUND

1. Field

Embodiments relate to a line structure and a flat panel display device having the same.

2. Description of the Related Art

In general, a flat panel display device such as a liquid crystal display (LCD), plasma display panel (PDP) or an organic light emitting display (OLED) is manufactured through a semiconductor device manufacturing process. In the semiconductor device manufacturing process, lines connecting thin film transistors, capacitors and circuits are formed as patterns having fine width and interval, and the patterns are arranged into a multi-layered structure with an interlayer insulation layer interposed therebetween.

The patterns are arranged at a fine interval, and the thickness of the interlayer insulation layer is also thin. Hence, in a case where a defect such as a particle or contamination occurs in a photolithography process of forming patterns, adjacent lines or lines intersecting each other with the interlayer insulation layer interposed therebetween may be short circuited with each other.

A failure of a line, caused by the short circuit, may be detected through a test in an inspecting process that is a final step of the manufacturing process, and the detected failure is removed through a repair process, thereby reducing manufacturing cost.

SUMMARY

Embodiments are directed to providing a line structure for repair according to an aspect of the present invention may include a first line in one direction, a second line parallel with the first line, the second line having end portions coupled to the first line, and a third line intersecting the first and second lines, wherein at least one portion of the second line is made of undoped poly-silicon.

The first and second lines may be insulated from each other by an insulation layer, and both the side portions of the second line may be electrically connected to the first line through contact holes formed in the insulation layer. The second line at a predetermined portion including the contact hole may be made of doped poly-silicon.

The second line at a portion intersecting the third line may be made of undoped poly-silicon. Disconnections may occur in the respective first lines at both sides of the third line, and the second line at the portion intersecting the third line may be doped with an impurity ion.

Embodiments are directed to providing a flat panel display device may have a line structure, including a plurality of first lines arranged in one direction; at least one second line parallel with the first lines, each second line having end portions connected to the first line, a plurality of third lines arranged to intersect the first lines, a plurality of fourth lines arranged to intersect the first and second lines, and a plurality of pixels connected between the first and third lines, wherein at least one portion of each second line is made of undoped poly-silicon.

The first and second lines may be insulated from each other by an insulation layer, and both the side portions of the second line may be electrically connected to the first line through contact holes formed in the insulation layer. The second line at a predetermined portion including the contact hole may be made of doped poly-silicon.

The second line at a portion intersecting the fourth line may be made of undoped poly-silicon. Disconnections may occur in the respective first lines at both sides of the fourth line, and the second line at the portion intersecting the fourth line may be doped with an impurity ion.

A repair line may be connected to any one of two lines so as to provide against a case where the two lines electrically contact each other at the intersection portion thereof. Both side portions of the repair line are electrically connected to the one line, but at least one portion of the repair line does not have conductivity. Hence, the self-resistance of the one line is not increased.

DETAILED DESCRIPTION

Hereinafter, exemplary embodiments will be described in detail with reference to the accompanying drawings.

Figure 1:
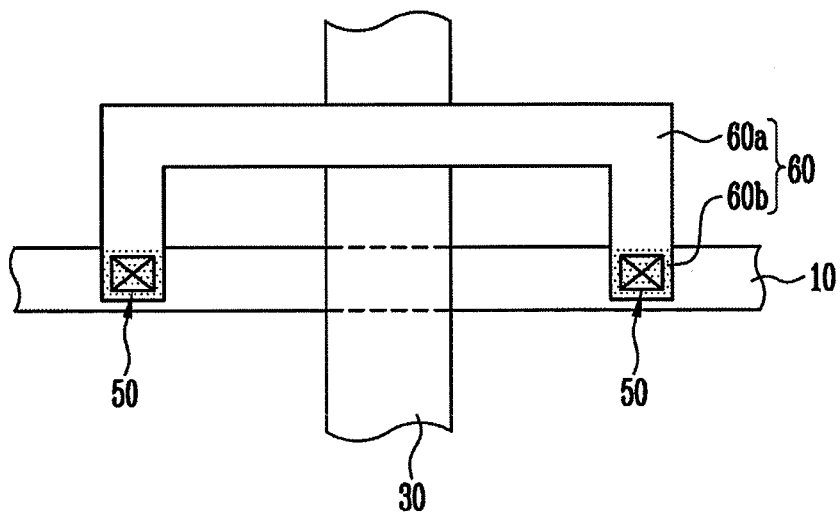
FIG. 1 is a plan view illustrating a line structure according to an embodiment.
Figure 2:
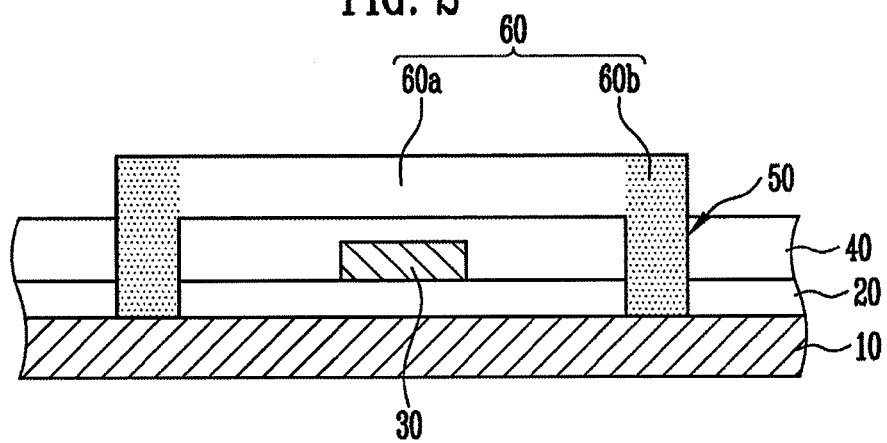
FIG. 2 is a sectional view illustrating the line structure according to the embodiment.

FIGS. 1 and 2 are plan and sectional views, respectively, illustrating a line structure according to an embodiment. Referring to FIG. 1, a first line 10 is formed to extend in one direction. The first line 10 may be a signal line connecting a device to a device or a power line supplying power.

A second line 60 is formed in parallel with the first line 10. The second line 60 is disposed as a repair line at a predetermined portion of the first line 10. Both side portions of the second line 60 are electrically connected to the first line 10.

A third line 30 is formed to intersect the first line 10 and the second line 60. The third line 30 may be a signal line connecting a device to a device or a power line supplying power.

Referring to FIGS. 1 and 2, the second line 60 may be electrically insulated from the first line 10 by insulation layers 20 and 40, and both the side portions of the second line 60 may be electrically connected to the first line 10 through contact holes 50 formed in the insulation layers 20 and 40.

The second line 60 may be formed of poly-silicon, and at least one portion of the second line 60 may be made of undoped poly-silicon 60a doped with no impurity. The second line 60 at a predetermined portion including the contact hole 50 may be made of doped poly-silicon 60b doped with an impurity ion.

If the second line 60 at the portion intersecting the third line 30 is formed of the undoped poly-silicon 60a, the second line 60 does not have conductivity even though the second line 60 at the predetermined portion including the contact hole 50 is formed of the doped poly-silicon 60b. Hence, the self-resistance of the first line 10 is not increased.

The first and third lines 10 and 30 may be formed of a conductive material such as doped poly-silicon or metal.

Figure 3:
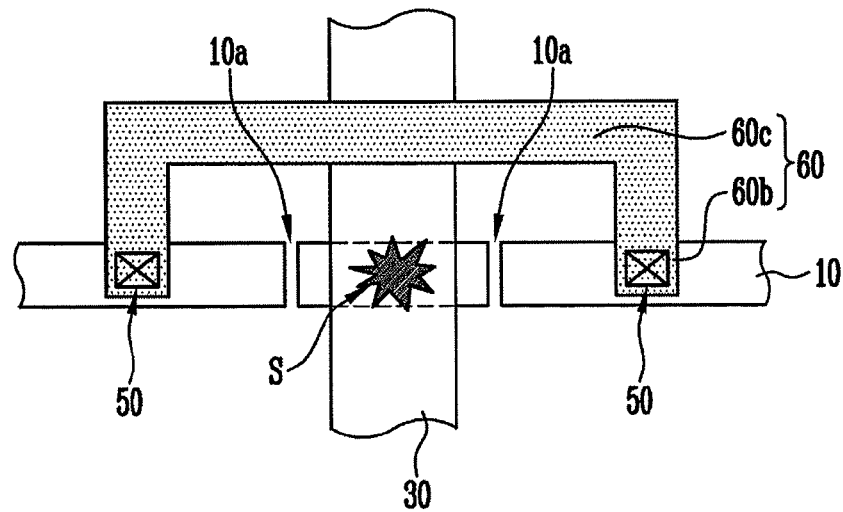
FIG. 3 is a plan view illustrating a repair process of the line structure according to the embodiment.

FIG. 3 is a plan view illustrating a repair process of the line structure according to the embodiment.

Referring to FIG. 3, in a case where a short circuit (S) occurs at the intersection portion of the first and third lines 10 and 30, disconnections 10a occur in the respective first lines 10 at both side portions of the third line 30, so that the first and third lines 10 and 30 are electrically separated from each other. Then, the second line 60 at the portion intersecting the third line 60 is doped with an impurity ion.

The undoped poly-silicon 60a is changed into doped poly-silicon 60c by the doping of the impurity ion, so that the second line 60 entirely has conductivity. Accordingly, the disconnected first lines 10 are electrically connected to each other by the second line 60 having the conductivity so as to be repaired.

The second line 60 may be positioned at the uppermost portion of the line structure in order to allow the undoped poly-silicon 60a to be easily doped with the impurity ion. For example, the insulation layer 20 is formed on the first line 10, and the third line 30 is disposed on the insulation layer 20. Then, the insulation layer 40 is formed on the insulation layer 20 including the third line 30, and the second line 60 is disposed on the insulation layer 40. Both the side portions of the second line 60 are electrically connected to the first line 10 through the contact holes 50 formed in the insulation layers 20 and 40.

The second line 60 is positioned at the uppermost portion of the line structure, so that the undoped poly-silicon 60a can be easily doped with the impurity ion without using a separate mask, thereby easily performing the repair process.

Since it is difficult or even impossible to disconnect a line of which thickness is thick, using laser or the like, the first line 10 may be thinner than the third line 30.

The line structure according to this embodiment can be applied to a flat panel display device and the like.

Figure 4:
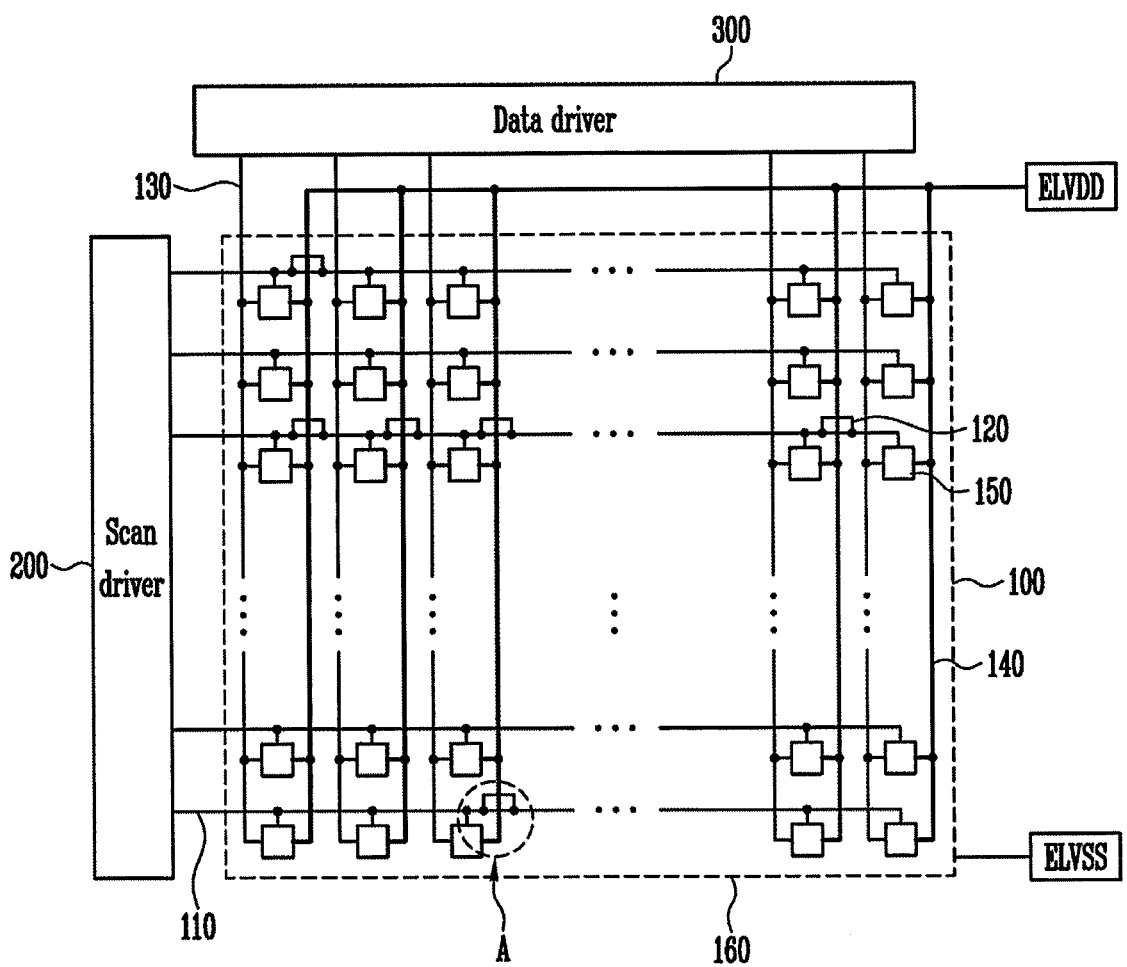
FIG. 4 is a plan view illustrating a flat panel display device according to an embodiment.

FIG. 4 is a plan view illustrating a flat panel display device having the line structure according to an embodiment. Referring to FIG. 4, the flat panel display device includes a pixel unit 100 displaying an image, and a scan driver 200 and a data driver 300, which provide signals for displaying the image.

The pixel unit 100 includes a plurality of scan lines 110 and a plurality of data lines 130, arranged to intersect each other, at least one repair line 120 connected to at least one of the scan and data lines 110 and 130, a plurality of pixel 150 connected between the scan and data lines 110 and 130, and power lines 140 and 160 supplying power voltages ELVDD and ELVSS to the pixels 150.

The plurality of scan lines 110 as first lines are arranged in parallel to extend in one direction.

The repair line 120 as a second line is formed in parallel with the scan line 110, and both side portions of the repair line 120 are electrically connected to the scan line 110. The repair line 120 may be connected in one or plural numbers to one scan line 110, when necessary. In this embodiment, the structure in which the repair line 120 is connected to the scan line 110 has been described as an example. However, the repair line 120 may be connected to the data line in the same structure, and embodiments are not particularly limited as long as the repair line 120 is connected to any portion necessary for repair.

The plurality of data lines 130 as third lines are arranged in parallel to intersect the scan lines 110.

The power lines 140 as fourth lines are arranged to intersect the scan lines 110 and the repair line 120. In this embodiment, the structure in which the power lines 140 extend in parallel with the data lines 130 along the data lines 130 and intersect the scan lines 110 has been described as an example. Alternatively, the power lines 140 may be formed into a mesh structure in which the power lines 140 extend in parallel with the respective scan and data lines 110 and 130.

Figure 5:
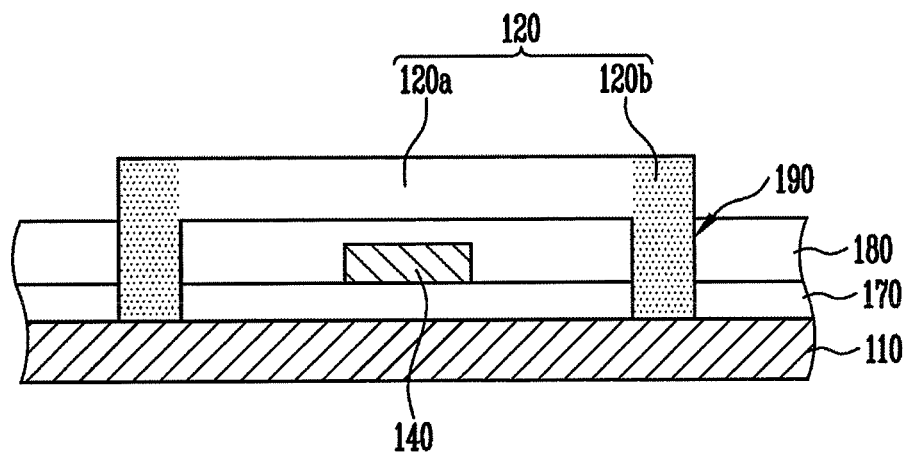
FIG. 5 is a sectional view illustrating the flat panel display device according to the embodiment.

Referring to FIG. 5, the repair line 120 may be electrically insulated from the scan line 110 by insulation layers 170 and 180, and both the side surfaces of the repair line 120 may be electrically connected to the scan line 110 through contact holes 190 formed in the insulation layers 170 and 180.

The repair line 120 may be formed of poly-silicon, and at least one portion of the repair line 120 may be made of undoped poly-silicon 120a doped with no impurity ion. The repair line 120 at a predetermined portion including the contact hole 190 may be made of doped poly-silicon 120b doped with an impurity ion.

If the repair line 120 at the portion intersecting the power line 140 is formed of the undoped poly-silicon 120a, the repair line 120 does not have conductivity even though the repair line 120 at the predetermined portion including the contact hole 190 is formed of the doped poly-silicon 120b. Hence, the self-resistance of the scan line 110 is not increased.

The scan lines 110, the data lines 130, the power lines 140 and 160 may be formed of a conductive material such as doped poly-silicon or metal.

The plurality of pixels 150 may be connected, e.g., in a matrix form between the scan and data lines 110 and 130, and receive the power voltages ELVDD and ELVSS supplied through the power lines 140 and 160. The pixel 150 may include an organic light emitting display device having an organic emission layer interposed between anode and cathode electrodes thereof. Alternatively, the pixel 150 may include a liquid crystal device having a liquid crystal layer interposed between two electrodes, e.g., pixel and common electrodes. In this embodiment, the structure in which the power line 140 supplying the power voltage ELVDD is connected to each of the plurality of pixels 150 and the power line 160 supplying the power voltage ELVSS is commonly connected to the plurality of pixels 150 has been described as an example.

The scan driver 200 is disposed at one side of the pixel unit 100. The scan driver 200 is connected to the plurality of scan lines 110 extended from the pixel unit 100. The scan driver 200 receives a control signal input from the outside thereof and generates a scan signal so as to provide the generated scan signal to the scan lines 110.

The data driver 300 is disposed at another side of the pixel unit 100. The data driver 300 is connected to the plurality of data lines 130 extended from the pixel unit 100. The data driver 300 receives a control signal and data, input from the outside thereof and generates a data signal so as to provide the generated data signal to the data lines 130.

In the flat panel display device configured as described above, the power line 140 is disposed between two adjacent scan lines 110. The power line 140 is formed thicker (e.g., 100 µm or more) than the scan line 110 or the data line 130.

The power line 140 intersects the scan line 130. Hence, in a case where a defect or the like occurs in an interlayer insulation layer in a manufacturing process, the power line 140 may be short-circuited with the scan line 110. The failure caused by the short circuit may be detected through a line test and a position test in an inspecting process, and the failure is removed through the repair process.

Figure 6:
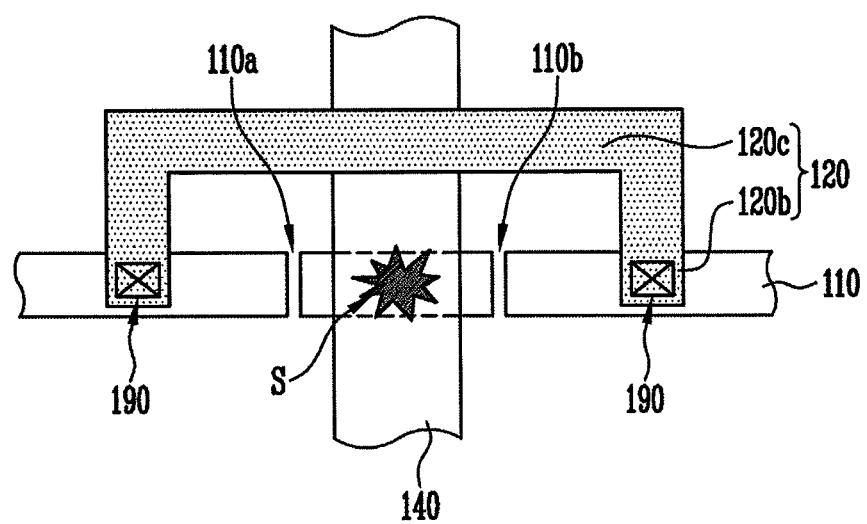
FIG. 6 is a plan view illustrating a repair process of the flat panel display device according to the embodiment.

FIG. 6 is a plan view illustrating a repair process of the flat panel display device according to the embodiment. FIG. 6 illustrates in detail portion A of FIG. 4.

Referring to FIG. 6, in a case where a short circuit S occurs at an intersection portion of the scan line 110 and the power line 140, disconnections 110a occurs in the respective scan lines 110 at both side portions of the power line 140, so that scan line 110 and the power line 140 are electrically separated from each other. Then, the repair line 120 at the portion intersecting the power line 140 is doped with an impurity ion.

The undoped poly-silicon 120a is changed into doped poly-silicon 120c by the doping of the impurity ion, so that the repair line 120 entirely has conductivity. Accordingly, the disconnected scan lines 110 are electrically connected to each other by the second line 60 having the conductivity so as to be repaired.

The repair line 120 may be positioned at the uppermost portion of the line structure in order to allow the undoped poly-silicon 120a to be easily doped with the impurity ion.

Referring to FIG. 5, for example, the insulation layer 170 may be formed on the scan line 110, and the power line 140 may be disposed on the insulation layer 170. Then, the insulation layer 180 is formed on the insulation layer 170 including the power line 140, and the repair line 120 is disposed on the insulation layer 180. Both the side portions of the repair line 120 are electrically connected to the scan line 110 through the contact holes 190 formed in the insulation layers 170 and 180.

The repair line 120 is positioned at the uppermost portion of the line structure, so that the undoped poly-silicon 120a can be easily doped with the impurity ion without using a separate mask, thereby easily performing the repair process.

According to this embodiment, the power line 140 of which width and/or thickness is thick is not cut, but the scan line 110 of which width and/or thickness is relatively thin is cut. Thus, the repair process can be easily performed. Further, all the pixels 150 can be normally operated even after the repair process is performed, and thus, damage caused by the repair process may be reduced or eliminated.

By way of summation and review, typically a power line supplying power has a width and/or thickness relatively greater than that of general signal lines connecting circuits. Hence, the power line is easily short-circuited with another line adjacent to or intersecting the power line. In order to repair the short circuit, the thick line should be cut, e.g., using a laser beam, and therefore, it is difficult to perform the repair process. Moreover, power or signal is not supplied through the cut line. Although the power or signal is supplied through an auxiliary line relatively thinner than the cut line, some circuits or devices may not be normally operated.

A line structure according to one or more embodiments enables a failure of a line to be easily repaired. In particular, a line failure due to a short circuit between a first line and a third line, which is thicker and/or wider than the first line, may result in a first line being cut, rather than the third line, while a second line, parallel to and connected to the first line, may be rendered conductive, e.g., doped with an impurity ion, to by-pass the short circuit. A flat panel display device according to an aspect of the one or more embodiments is capable of minimizing damage caused by repair. Thus, the repair process can be easily performed. Further, power or signals can be normally transmitted even after the repair process is performed, and thus, no damage caused by the repair process occurs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A line structure for repair, comprising:
a first line in one direction;
a second line parallel with the first line, the second line having end portions coupled to the first line; and
a third line intersecting the first and second lines,
wherein at least one portion of the second line includes undoped poly-silicon such that the at least one portion of the second line does not have conductivity.

2. The line structure of claim 1, wherein the first and third lines include doped poly-silicon or metal.

3. The line structure of claim 1, wherein the first and second lines are insulated from each other by an insulation layer, and both the side portions of the second line are coupled to the first line through contact holes in the insulation layer.

4. The line structure of claim 3, wherein the second line at a predetermined portion including the contact hole includes doped poly-silicon.

5. The line structure of claim 1, wherein the second line at a portion intersecting the third line includes undoped poly-silicon such that the at least one portion of the second line does not have conductivity.

6. The line structure of claim 5, wherein if disconnections occur in the first line at both sides of the third line, the second line at the portion intersecting the third line is doped with an impurity ion.

7. The line structure of claim 6, wherein the first and third lines electrically contact each other at a portion the first and third lines intersect each other.

8. The line structure of claim 1, wherein the third line is thicker than the first line.

9. A flat panel display device, comprising:
a plurality of first lines in one direction;
at least one second line parallel with the first lines, each second line having end portions connected to the first line;
a plurality of third lines intersecting the first lines;
a plurality of fourth lines intersecting the first and second lines; and
a plurality of pixels coupled between the first and third lines,
wherein at least one portion of each second line includes undoped poly-silicon such that the at least one portion of each second line does not have conductivity.

10. The flat panel display device of claim 9, wherein the plurality of fourth lines are respectively alternately arranged between the plurality of third lines.

11. The flat panel display device of claim 9, wherein the fourth line is thicker than the first line.

12. The flat panel display device of claim 9, wherein the first and third lines include doped poly-silicon or metal.

13. The flat panel display device of claim 9, wherein the first and second lines are insulated from each other by an insulation layer, and both the side portions of the second line are coupled to the first line through contact holes in the insulation layer.

14. The flat panel display device of claim 13, wherein the second line at a predetermined portion including the contact hole includes doped poly-silicon.

15. The flat panel display device of claim 9, wherein the second line at a portion intersecting the fourth line includes undoped poly-silicon such that the at least one portion of second line does not have conductivity.

16. The flat panel display device of claim 15, wherein if disconnections occur in the first line at both sides of the fourth line, the second line at the portion intersecting the fourth line is doped with an impurity ion.

17. The flat panel display device of claim 16, wherein the first and fourth lines electrically contact each other at a portion the first and fourth lines intersect each other.

* * * * *